(12) United States Patent
Swanson

(10) Patent No.: US 9,634,652 B1
(45) Date of Patent: Apr. 25, 2017

(54) METHOD AND APPARATUS FOR CONFIGURING DELAY LINES

(71) Applicant: Marvell International Ltd., Hamilton (BM)

(72) Inventor: Ross Swanson, Lyons, CO (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/013,150

(22) Filed: Feb. 2, 2016

Related U.S. Application Data

(60) Provisional application No. 62/112,822, filed on Feb. 6, 2015.

(51) Int. Cl.
| H03K 5/131 | (2014.01) |
| H03K 5/14 | (2014.01) |
| H03K 5/00 | (2006.01) |

(52) U.S. Cl.
CPC ..... *H03K 5/14* (2013.01); *H03K 2005/00019* (2013.01); *H03K 2005/00286* (2013.01)

(58) Field of Classification Search
USPC ................................................. 327/100–333
See application file for complete search history.

(56) References Cited

U.S. PATENT DOCUMENTS

| 7,184,509 | B2* | 2/2007 | Cho | H03K 5/13 327/158 |
| 2006/0044037 | A1* | 3/2006 | Gomm | G11C 7/106 327/261 |
| 2006/0126714 | A1* | 6/2006 | Lin | H04L 1/205 375/226 |
| 2009/0295449 | A1* | 12/2009 | Dixon | G01R 31/31725 327/276 |
| 2010/0194456 | A1* | 8/2010 | Kang | H03K 5/00006 327/158 |
| 2014/0035650 | A1* | 2/2014 | Zerbe | H03L 7/06 327/299 |
| 2014/0091844 | A1* | 4/2014 | Jakobsson | H03L 7/1974 327/158 |

* cited by examiner

*Primary Examiner* — Brandon S Cole

(57) ABSTRACT

Embodiments include an apparatus including: a first delay line and a second delay line, wherein the first delay line is configured to receive a clock signal and output a first delayed signal, and wherein the second delay line is configured to receive the first delayed signal and output a second delayed signal; a first control circuit configured to (i) apply a first delay select to the first delay line and the second delay line such that the second delayed signal is delayed with respect to the clock signal by a half-clock period, and (ii) apply a second delay select to the first delay line such that the first delayed signal is delayed with respect to the clock signal by the half-clock period; and a second control circuit configured to control a third delay line based on the first delay select and the second delay select.

20 Claims, 6 Drawing Sheets

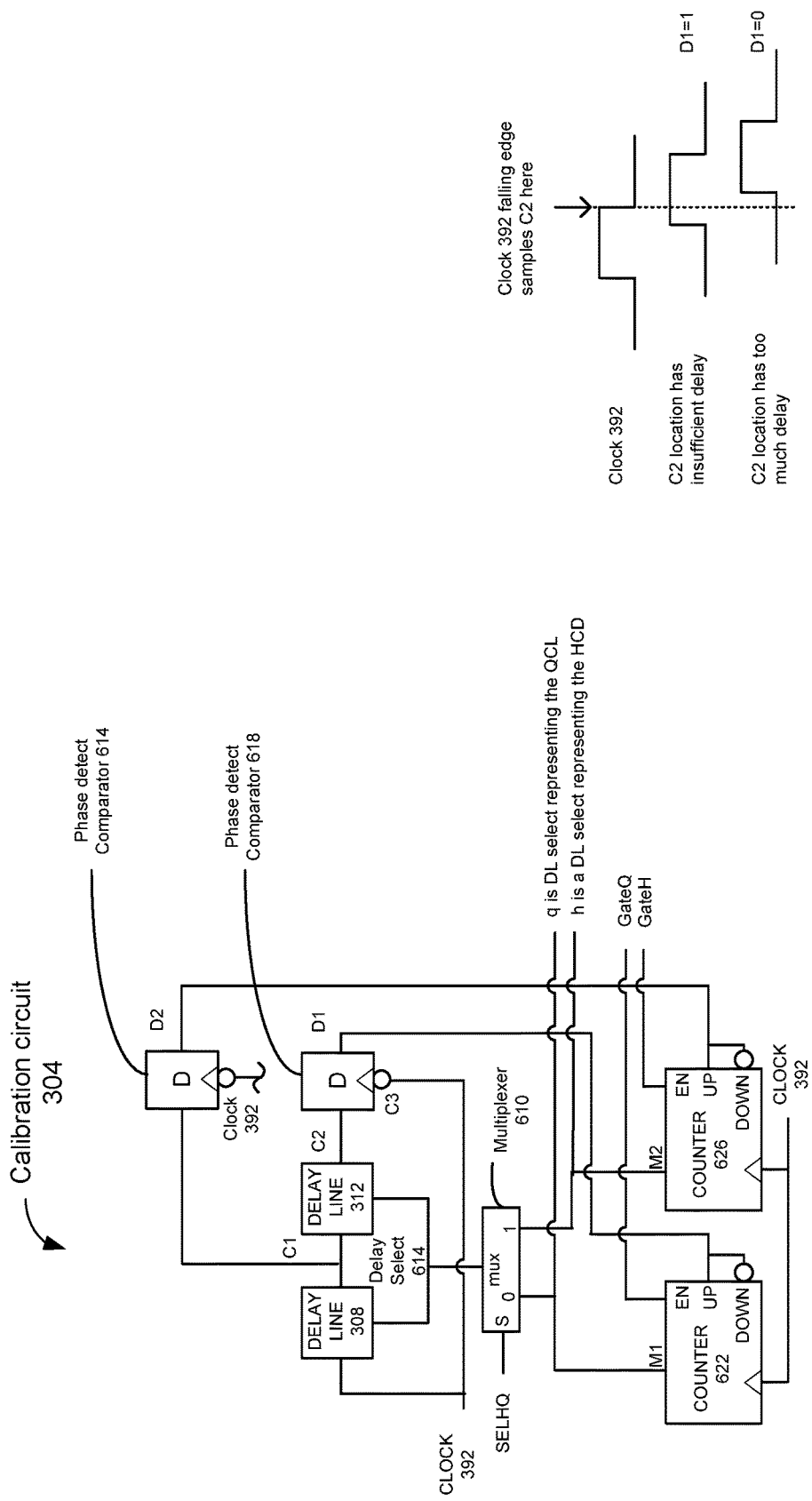

METHOD AND APPARATUS FOR CONFIGURING DELAY LINES

CROSS REFERENCE TO RELATED APPLICATIONS

This disclosure claims priority to U.S. Provisional Patent Application No. 62/112,822, filed on Feb. 6, 2015, which is incorporated herein by reference in its entirety.

TECHNICAL FIELD

Embodiments of the present disclosure relate to delay lines, and in particular to configuring delay lines.

BACKGROUND

A delay line in an electric circuit receives an input signal, and outputs an output signal that is a delayed version of the input signal. In an example, a time period by which the delay line delays the input signal may be configurable. For example, the delay line receives a configurable parameter (henceforth also referred to as "delay select"), and based on the value of the delay select, delays the input signal. For example, for a first value of the delay select, the delay line delays the input signal by a corresponding first time period; and for a second value of the delay select, the delay line delays the input signal by a corresponding second time period.

In a typical delay line, a minimum amount of time period by which the delay line can delay an input signal is referred to as an intrinsic delay of the delay line. Thus, irrespective of the delay select, the delay line delays an input signal by at least the intrinsic delay of the delay line. In some circuits, it may be advantageous to measure the intrinsic delay of a delay line, and utilize such measurement in selecting the delay select of other delay lines.

SUMMARY

In various embodiments, the present disclosure provides an apparatus comprising: a calibration circuit comprising (i) a first delay line and (i) a second delay line, wherein the first delay line is configured to receive a clock signal and output a first delayed signal, and wherein the second delay line is configured to receive the first delayed signal and output a second delayed signal; a first control circuit configured to, during a first mode of operation, apply a first delay select to the first delay line and the second delay line such that the second delayed signal is delayed with respect to the clock signal substantially by a half-clock period, and during a second mode of operation, apply a second delay select to the first delay line such that the first delayed signal is delayed with respect to the clock signal substantially by the half-clock period; an application circuit comprising a third delay line; and a second control circuit configured to (i) receive the first delay select and the second delay select, and (ii) control the third delay line based at least in part on the first delay select and the second delay select.

In various embodiments, the present disclosure also provides a method comprising: receiving, by a first delay line, a clock signal; outputting, by the first delay line, a first delayed signal; receiving, by a second delay line, the first delayed signal; outputting, by the second delay line, a second delayed signal; during a first mode of operation, applying, by a first control circuit, a first delay select to the first delay line and the second delay line such that the second delayed signal is delayed with respect to the clock signal substantially by a half-clock period; during a second mode of operation, applying, by the first control circuit, a second delay select to the first delay line such that the first delayed signal is delayed with respect to the clock signal substantially by the half-clock period; and controlling, by a second control circuit, a third delay line based at least in part on the first delay select and the second delay select.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

FIG. 6 illustrates the calibration circuit of FIG. 3 is more detail, in accordance with an embodiment.

FIG. 7 illustrates an example timing diagram showing an operation of a phase detect comparator included in the calibration circuit of FIG. 3, in accordance with an embodiment.

DETAILED DESCRIPTION

Figure 1:
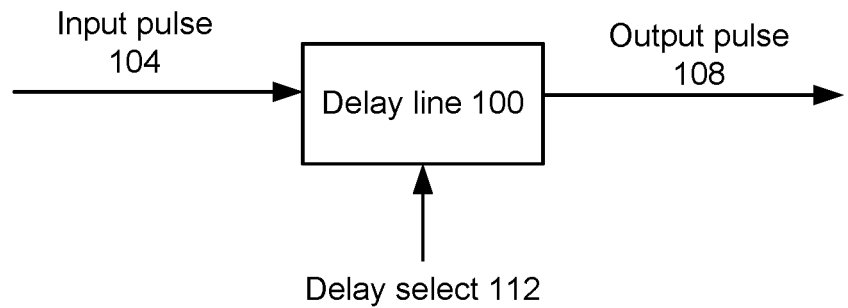
FIG. 1 schematically illustrates an example delay line.

FIG. 1 schematically illustrates an example delay line 100. The delay line 100 receives an input pulse 104, and outputs an output pulse 108. The output pulse 108 is delayed with respect to the input pulse 104 by a delay amount. The delay amount is based on a delay select parameter, which is henceforth referred to as "delay select 112." FIG. 2 illustrates a graphical relationship between the delay amount by which the output pulse 108 is delayed with respect to the input pulse 104, and the delay select 112.

Figure 2:
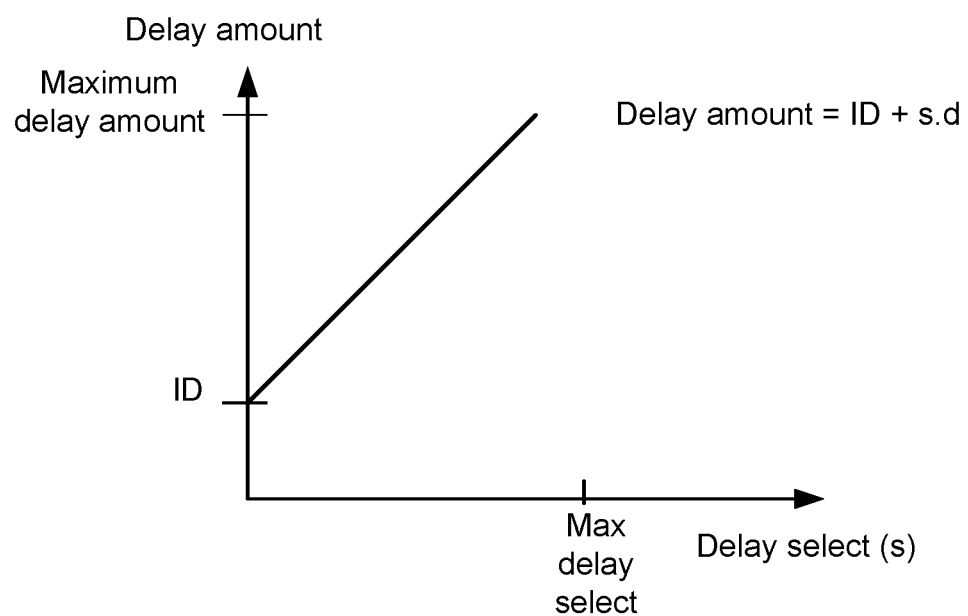
FIG. 2 illustrates a graphical relationship between a delay amount and a delay select of the delay line of FIG. 1.

Referring to FIGS. 1 and 2, the delay 100 generates a non-zero delay amount even if the delay select 112 is zero. This non-zero delay amount is the minimum delay amount that the delay line 100 can generate, as is also referred to as intrinsic delay (ID) value of the delay line 100.

As the delay select 112 is increased, the delay amount also linearly increases. For example, if the delay select 112 is represented by s, then the delay amount can be represented by (ID+s.d), where d is a slope of the line in the graph in FIG. 2. In FIG. 2, d represents an incremental delay amount, based on an incremental increase of the delay select s (i.e., if s is increased by one unit from its previous value, the delay amount is also increased by d units).

The delay line 112 also has a maximum delay amount, which corresponds to a maximum value of the delay select. The delay select cannot be increased beyond this value. In an example, if a delay amount higher than the maximum delay amount is desired, then multiple delay lines can be used to series to achieve a higher delay amount. In another example, an effective delay amount higher than the maximum delay amount can be achieved by delaying the input pulse 104 (e.g., by using a subsequent pulse as the input pulse 104), as will be discussed in more details herein later.

Figure 3:
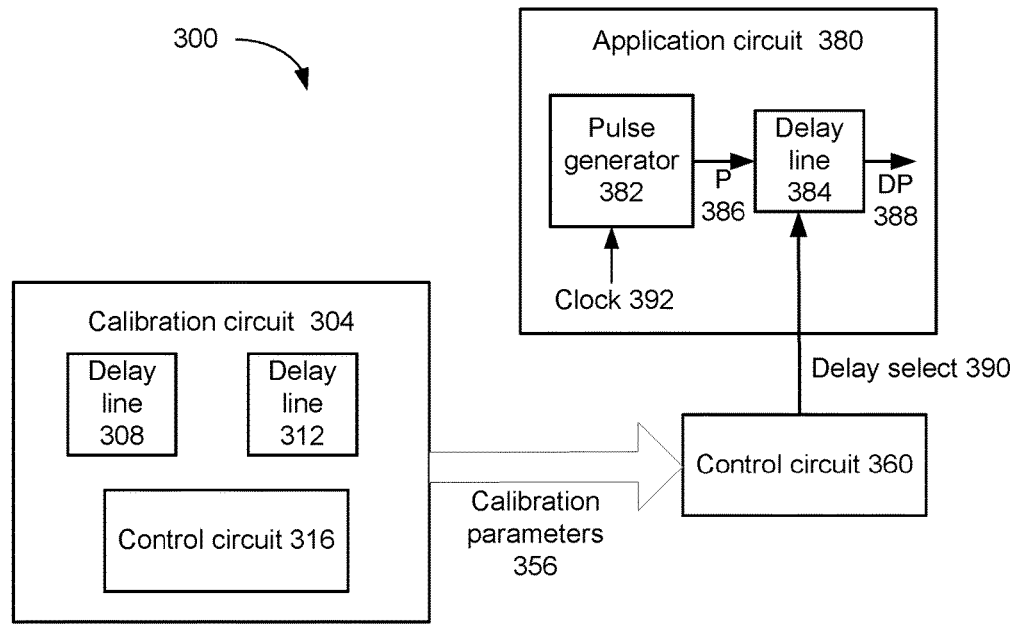
FIG. 3 illustrates a circuit comprising an application circuit including a delay line, a calibration circuit including a plurality of delay lines, and a control circuit, in accordance with an embodiment.

FIG. 3 illustrates a circuit 300 comprising a plurality of delay lines. The circuit 300, for example, is included within a die, a system on a chip (SOC), an integrated circuit, and/or the like. In an embodiment, the circuit 300 comprises a calibration circuit 304, a control circuit 360 and an application circuit 380. Although the circuit 300 includes various other components, only some of the components of circuit 300 (e.g., those components that are relevant to this disclosure) are illustrated in FIG. 3 for purposes of clarity.

The application circuit 380 (and the circuit 300, including the die in which the circuit 300 is incorporated) can be used for any appropriate purposes. In an example, the application circuit 380 is used within a read interface of a memory (e.g., within a read interface of a Double data rate synchronous dynamic random-access memory (DDR SDRAM)). In another example, the application circuit 380 is used within any appropriate circuit that uses a delay line to delay signals.

The calibration circuit 304 comprises a plurality of delay lines, e.g., delay lines 308 and 312, and a control circuit 316. In an example, the control circuit 316 comprises circuitry to control the delay lines 308 and 312 (e.g., comprises circuitry to select and apply delay selects to the delay lines 308 and 312, as will be discussed in more detail herein later). In an example, the delay lines 308 and 312 and the control circuit 316 form one or more delay locked loops, as will be discussed in more detail herein later.

The application circuit 380 comprises a delay line 384 (although, in another example, the application circuit 380 comprises more than one delay line). In an embodiment, as the application circuit 380 and the calibration circuit 304 are included in the same die, same SOC or the same integrated circuit, variation of a manufacturing process, voltage and/or temperature are likely to affect the delay lines 308, 312 and 384 in a substantially similar manner. Accordingly, it is assumed that the delay lines 308, 312 and 384 have similar or substantial similar properties. For example, it is assumed that the delay lines 308, 312 and 384 have similar or substantial similar intrinsic delay (ID) values.

In an embodiment, the application circuit 380 comprises a pulse generation circuit 382 generating a stream of pulses P 386, based on a clock signal 392. The stream of pulses P 386 is received by the delay line 384. The delay line 384 also receives a delay select 390 from the control line 360. Based on a value of the delay select 390, the delay line 384 delays the stream of pulses P 386 to generate a delayed stream of pulses DP 388.

In an embodiment, the calibration circuit 304 outputs one or more parameters associated with the delay lines 308 and/or 312 to the control circuit 360. For example, the calibration circuit 304 outputs calibration parameters 356, which are associated with one or more parameters associated with the delay lines 308 and/or 312. As discussed herein above, the delay lines 308, 312 and 384 have similar or substantial similar properties, e.g., intrinsic delay (ID) values. In an embodiment, the control circuit 360 uses the calibration parameters 356 to select the value of the delay select 390, as will be discussed in more detail herein later.

Figure 4:
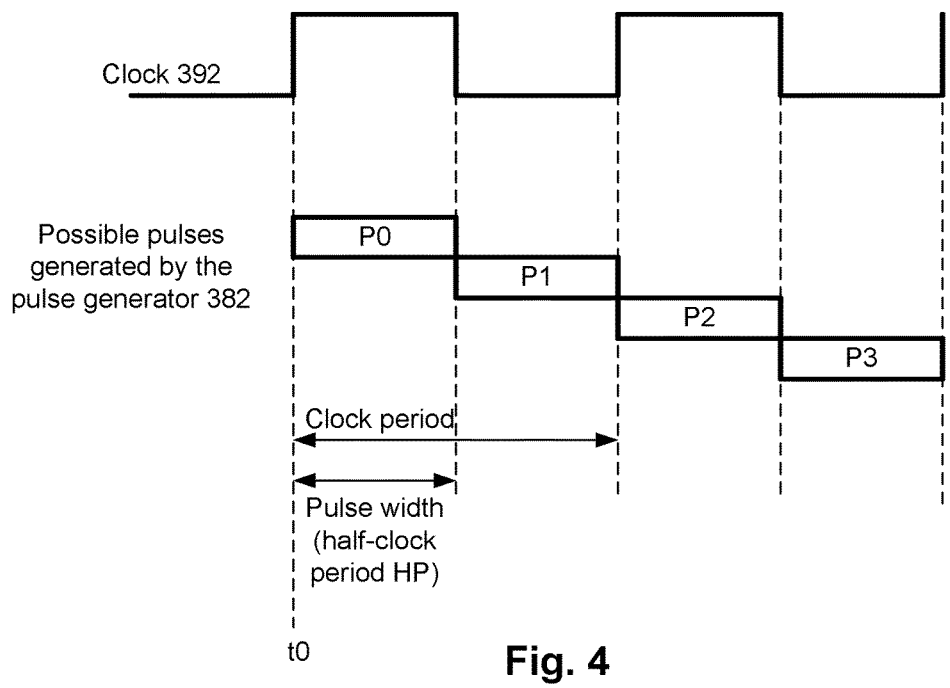
FIG. 4 illustrates possible pulses that can be generated by a pulse generator, in accordance with an embodiment.

FIG. 4 illustrates possible pulses that can be generated by the pulse generator 382. Thus, FIG. 4 illustrates possible pulses P 386 with respect to the clock signal 390. For example, the pulse generator 382 can generates pulses P0, P1, P2 and/or P3 (also referred to as pulses P 386, as illustrated in FIG. 3). In an embodiment, each of the pulses P0, . . . , P3 has a pulse width that is equal to a half period (HP) of the clock 390. Thus, the pulse width of the pulses P 386 is equal to half clock period (HP) of the clock 390. The pulses P 386 can be generated at the rising edge and/or the falling edge of the clock 390. In FIG. 4, the rising edge of the first clock cycle occurs at time to.

Although FIG. 4 illustrates pulses P0, P1, P2 and P3, the pulse generator 382 may generate, for example, only pulses P0 and P2 (or only pulses P1 and P3, or only pulses P0, P1 and P3, or the like), based on an application of the application circuit 380.

Figure 5:
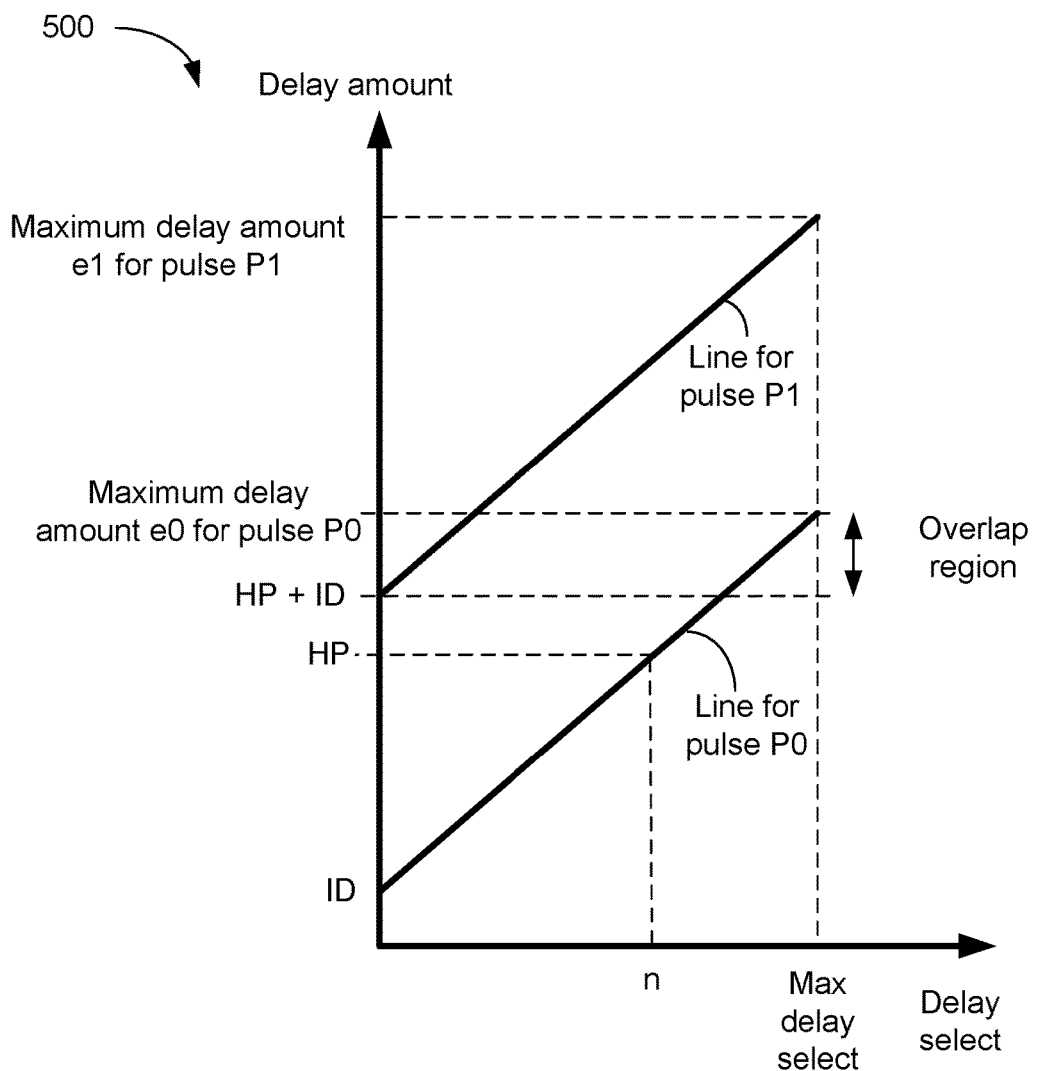
FIG. 5 illustrates a graph depicting a delay amount in the application circuit of FIG. 3, in accordance with an embodiment.

FIG. 5 illustrates a graph 500 depicting a delay amount in the application circuit 380 of FIG. 3. The X-axis of the graph 500 represents the delay amount, measured from time t0 of FIG. 4 (i.e., measured from the first rising edge of the clock 392). The Y-axis represents the delay select 390 of FIG. 3.

The graph 500 of FIG. 5 includes two lines for two corresponding adjacent pulses of FIG. 4. Merely as an example, the two lines in the graph 500 are for adjacent pulses P0 and P1 (although the two lines can be, for example, adjacent pulses P1 and P2). Referring to the line for pulse P0, assume that the delay line 384 receives the pulse P0 at time t0, as illustrated in FIG. 4. When the delay select 390 is zero, the delay amount in the delay line 384 is equal to the intrinsic delay (ID) value of the delay line 384. As the delay select 390 is increased, the delay amount increases linearly (e.g., as discussed with respect to FIG. 2), until the maximum delay select is reached. When the maximum delay select is reached, the delay amount is equal to a maximum delay amount e0 for the pulse P0. As illustrated in FIG. 5, the delay select 390 is equal to a value n, when the delay amount is equal to the half-clock period HP.

As discussed with respect to FIG. 4, the pulse width of the pulses P0, . . . , P3 is equal to the half-clock period HP. The delay line 384, thus, receives the pulse P1 at half-clock period HP form time t0. Due to the intrinsic delay (ID) value of the delay line 384, if the delay select 390 is zero, the delay line 384 outputs the pulse P1 at time (HP+ID) from time t0, as illustrated in FIG. 5. As the delay select 390 is increased, the delay amount increases linearly (e.g., as discussed with respect to FIG. 2), until the maximum delay select is reached. When the maximum delay select is reached, the delay amount is equal to a maximum delay amount e1 for the pulse P1.

Thus, as seen from FIG. 5, if a pulse at the output of the delay line 384 (i.e., a pulse at DP 388) is desired at any time between ID and (HP+ID), the pulse at the output can be achieved by delaying the pulse P0 by an appropriate amount. Also, if a pulse at the output of the delay line 384 (i.e., a pulse at DP 388) is desired at any time between (HP+ID) and e0, the pulse at the output can be achieved by delaying either of the pulses P0 or P1 by an appropriate amount. Thus, the region between the delay amount (HP+ID) and e0 is referred to as "overlap region" in FIG. 5, e.g., because the delay amount between (HP+ID) and e0 can be achieved by either pulse P0 or pulse P1.

On the other hand, if a pulse at the output of the delay line 384 (i.e., a pulse at DP 388) is desired at any time between e0 and e1, the pulse at the output can be achieved by delaying the pulse P1 by an appropriate amount. Thus, the delay line 384 has to have a maximum delay amount that is at least as high as the half-clock period HP, for the delay line 384 to output a pulse at any desired time (i.e., by appropriately receiving one of the pulses P0 or P1, and appropriately setting the value of the delay select 390).

In an example, the transition of the output of the delay line 384 between pulses P0 and P1 is non-linear with respect to the delay select 390. The non-linearity arises because of the intrinsic delay (ID) value of the delay line 384 and the half-clock period HP. Knowing the values of delay select 390 that correspond to ID and HP may be beneficial to accurately output a pulse by the delay line 384 at any desired time, and smoothly transition from pulse P0 to pulse P1, as discussed in more detail herein later.

FIG. 6 illustrates the calibration circuit 304 of FIG. 3 is more detail. The calibration circuit 304 comprises the delay lines 308 and 312 connected in series. The delay line 308 receives the clock 392, and outputs a signal C1. C1 is input to the delay line 312, which outputs a signal C2. C2 is received by a phase detect comparator 618, which is clocked by the clock 392. The phase detect comparator 618 outputs a signal D1, which is received by a counter 622 (e.g., which is an up-down counter). The counter 622 is driven by the clock 392.

The output C1 of the delay line 308 is also received by a phase detect comparator 614, which is clocked by the clock 392. The phase detect comparator 618 outputs a signal D2, which is received by a counter 626 (e.g., which is an up-down counter). The counter 626 is driven by the clock 392.

The counter 622 outputs a count value M1, while the counter 626 outputs a count value M2. A final value of the count value M1 is also referred to as "q," and a final value of the count value M2 is also referred to as "h."

A multiplexer 610 receives the count values M1 and M2, and selectively outputs one of the count values M1 and M2 as a delay select 614. The selection of the multiplexer 610 is controlled by a signal SelcHQ. The delay select 614 is provided to the delay lines 308 and 312, and is used to control the delay amount in the delay lines 308 and 312.

The delay lines 308, 312, the phase detect comparator 618, the counter 622, and the multiplexer 610 form a first delay locked loop (DLL)—this DLL is also referred to as a quarter cycle length (QCL) loop. The delay line 308, the phase detect comparator 614, the counter 626, and the multiplexer 610 form a second delay locked loop (DLL)—this DLL is also referred to as a half cycle delay (HCD) loop. During the calibration phase of the circuit 300 of FIG. 3, the QCL loop and the HCD are alternately enabled (e.g., the QCL loop is first enabled while the HCD loop is disabled, and the HCD loop is then enabled while the QCL loop is disabled).

The QCL loop is selectively enabled by the GateQ signal and the SelHQ signal. For example, if the GateQ signal is high, the counter 622 is enabled and the signal D1 causes the counter 622 to increment or decrement its output M1, thereby enabling the QCL loop. On the other hand, when the GateQ signal is low, the counter 622 is disabled, thereby disabling the QCL loop. Also, while the QCL loop is enabled, the SelHQ signal has to be such that the multiplexer 610 outputs the M1 count value from the counter 622.

The HCD loop is selectively enabled by the GateH signal and the SelHQ signal. For example, if the GateH signal is high, the counter 626 is enabled and the signal D2 causes the counter 626 to increment or decrement its output M2, thereby enabling the HCD loop. On the other hand, when the GateH signal is low, the counter 626 is disabled, thereby disabling the HCD loop. Also, while the HCD loop is enabled, the SelHQ signal has to be such that the multiplexer 610 outputs the M2 count value from the counter 626.

In an example, various components of the calibration circuit 304 (e.g., except for the delay lines 308 and 312), as illustrated in FIG. 6, are included in the control circuit 316 of FIG. 3.

In operation, while the QCL loop is enabled (e.g., via the signals GateQ and SelHQ), the delay lines 308 and 312, in series, delays the clock signal 392. The phase detect comparator 618 detects the phase of the signal C2 with respect to the clock 392, and accordingly outputs the signal D1.

FIG. 7 illustrates an example timing diagram showing an operation of the phase detect comparator 618. The QCL loop aims, via the below described operation of the phase detect comparator 618, to delay the signal C2 such that C2 lags the clock 392 by about half-clock period HP. It is to be noted that the operations described in FIG. 7 takes place when the QCL loop is enabled.

The top line in FIG. 7 illustrates the clock signal 392, and the bottom two lines illustrate two possible positions of the signal C2. For example, if the raising edge of C2 occurs prior to the falling edge of the clock 392 (i.e., if the delay lines 308 and 312 insufficiently delays C2), then D1 is set to 1 by the phase detect comparator 618. On the other hand, if the raising edge of C2 occurs subsequent to the falling edge of the clock 392 (i.e., if the delay lines 308 and 312 delays C2 too much), then D1 is set to 0 by the phase detect comparator 618. This is done by sampling the raising edge of C2 with respect to the falling edge of the clock 392.

If D1 is set to 1 by the phase detect comparator 618, then the counter 622 increments the count value M1 (e.g., increments the count value M1 by one), thereby resulting in slightly more delay in the delay lines 308 and 312. This results in the signal C2 being further delayed.

On the other hand, If D1 is set to 0 by the phase detect comparator 618, then the counter 622 decrements the count value M1 (e.g., decrements the count value M1 by one), thereby resulting in slightly less delay in the delay lines 308 and 312. This results in the signal C2 being less delayed.

Thus, within a few clock cycles of the start of the operation of the QCL loop, the count value M1 settles down so that C2 is delayed by about half-clock period HP of the clock 392 (e.g., C2 toggles around the half-clock period HP of the clock 392). That is, the count value M1 settles to a small range of values around a value that provides the delay of about half-clock period HP of the clock 392. This nominal value is referred to as "q". As the combination of the delay lines 308 and 312 provides half-clock period HP delay, each of the delay lines 308 and 312 provides a delay of about a quarter-clock period of the clock 392—hence, the QCL loop is referred to herein as quarter cycle length (QCL) loop, and hence, the nominal value of the steady state count value M1 is referred to as "q" (e.g., which represents a delay select value resulting in a quarter cycle delay in each of the delay lines 308 and 312).

Thus, the half-clock period HP delay in the QCL loop is given by:

$$\text{Half Period} = (\text{Delay in delay line } \mathbf{308}) + (\text{Delay in delay line } \mathbf{312}) \quad \text{Equation 1.}$$

The delay in each of the delay lines 308 and 312 is based on the intrinsic delay (ID) values of the delay lines 308 and 312, and the delay select value q (e.g., which is the nominal output of the counter 622). As discussed herein before, the intrinsic delay (ID) values of the delay lines 308, 312 and 384 are assumed to be substantial similar, and is given by ID. Thus, as discussed with respect to FIG. 2, equation 1 can be rewritten as:

$$\text{Half Period}=(ID+q*d)+(ID+q*d) \quad \text{Equation 2,}$$

which may be written as:

$$\text{Half Period}=2*ID+2*q*d. \quad \text{Equation 3.}$$

Referring to FIGS. 6 and 7, in an embodiment, the HCD loop works at least in part similar to the operation of the QCL loop. For example, as discussed herein previously, the HCD loop has a single delay line 308. The phase detect comparator 614 and the counter 626 aims to delay the signal C1 from the clock 392 by about half-clock period HP. Let "h" be the delay select 614 while the HCD loop is enabled (i.e., h is the nominal value of the count value M2, once the count value M2 settles down some time after the HCD loop is enabled). Because there is only one delay line 308 in the HCD loop, the delay line 308 solely generates the half-clock period HP—accordingly, the delay setting 614 for the delay line 308, which results in the delay line 308 generating about half-clock period HP delay, is referred to as "h" (to represent the half-clock period HP delay).

Thus, the half-clock period HP delay in the HCD loop is given by:

$$\text{Half Period}=ID+h*d. \quad \text{Equation 4}$$

As both the equations 3 and 4 represent the same half period, equating the right side of these two equation yields the following:

$$2*ID+2*q*d=ID+h*d, \quad \text{Equation 5}$$

Equation 5 can be simplified as:

$$ID=(h-2q)*d. \quad \text{Equation 6.}$$

Thus, equation 6 measures the intrinsic delay (ID) value of the delay lines of the circuit 300 of FIG. 3. For example, the intrinsic delay (ID) value of the delay lines, as derived from the calibration circuit 304, can be applied to control or operate the delay lines of the application circuit 380 (e.g., the delay line 384). With the values of h and q being measured in real-time (e.g., which accounts for process, voltage and temperature (PVT) variations in the circuit), these parameters may be used to operate the delay lines of the application circuit 380 (e.g., the delay line 384), as will be discussed in further detail herein later.

As discussed with respect to FIG. 5, to achieve a specific amount of delay, a pulse P0 or a pulse P1 can be used. However, the delay select 390, if the pulse P0 is used, will be different from the delay select 390 when the pulse P1 is used. In an embodiment, using the various parameters derived from the calibration circuit 304, it is possible to predict how to change the delay select 390 and the pulse positions to achieve a linear transition when a pulse moves from one pulse position to the next pulse position (e.g., moving from pulse P1 to either pulse P0 or P2), as discussed in more detail herein below.

Assume that a certain specific delay in the application circuit 380 is achieved using pulse P0, and is it desired to achieve substantially the same delay using pulse P1 (e.g., where the delays are measured relative to time t0 of FIG. 4). That is, it is desired to move from a pulse position W (e.g., which corresponds to the pulse P0) to a pulse position $W_{+1}$ (e.g., which corresponds to the pulse P1). Let the delay amount corresponding to the pulse position W be F and the delay amount corresponding to the pulse position $W_{+1}$ be F'. As the pulse position currently used is W, the delay amount of F is known, and we want to predict the delay amount F' corresponding to the new pulse position $W_{+1}$.

Given that the two pulses are to be generated with substantially similar delays (e.g., relative to the time t0 of FIG. 4), the following relationship holds:

$$W+F=W_{+1}+F' \quad \text{Equation 7}$$

Equation 7 is rearranged as follows:

$$F'=W-W_{+1}+F \quad \text{Equation 8}$$

As illustrated in FIG. 4, the pulse P1 is half-clock period HP delayed with respect to the pulse P0. That is, $(W_{-1}-W)$ is half-clock period HP. Also, as seen from equation 3, the half-clock period HP is equal to $(2*ID+2*q*d)$. Thus, equation 8 can be written as:

$$F'=-(2*ID+2*q*d)+F. \quad \text{Equation 9}$$

Let the delay select 390 for the pulse position W be f. That is, for the delay select 390 with the value of f, the delay amount is F. Similarly, let the delay select 390 for the pulse position $W_{+1}$ be f'. That is, for the delay select 390 with the value of f', the delay amount is F'. Thus, F=(ID+f*d), and F'=(ID+f'*d), as discussed with respect to FIG. 2. Hence, equation 9 can be rewritten as follows:

$$ID+f'*d=-(2*ID+2*q*d)+(ID+f*d). \quad \text{Equation 10}$$

Equation 10 can be written as:

$$f'*d=-3*ID-2*q*d+ID+f*d, \quad \text{Equation 11}$$

which can be written as:

$$f'*d=-2*ID-2*q*d+f*d. \quad \text{Equation 12}$$

As discussed with respect to equation 6, ID=(h−2q)*d. Replacing ID in equation 12 by the value of ID in equation 6 results in the following:

$$f'*d=-2*h*d+4*q*d-2*q*d+f*d, \quad \text{Equation 13}$$

which is rewritten as:

$$f'*d=-2*h*d+2*q*d+f*d. \quad \text{Equation 14}$$

Equation 14 is simplified by dividing each side by d as:

$$f'=f-2*(h-q). \quad \text{Equation 15}$$

So, the new delay select f' for the pulse position $W_{+1}$ can be determined from the old delay select f for the pulse position W, if the delay select values h and q are known. Also, the calibration circuit 304 of FIG. 7 outputs the delay select values h and q. Thus, the new delay select f' for the pulse position $W_{+1}$ can be determined from equation 15.

Equations 7-15 are associated with determining a delay select f' corresponding to a pulse position $W_{+1}$, when the delay select f corresponding to the pulse position W is known. In a similar manner, the following determines a delay select f" corresponding to a pulse position $W_{-1}$, when the delay select f corresponding to the pulse position W is known. For example, assume that currently pulse P3 is used with the delay select f, and it is desired to use pulse P2 instead but with a delay select f", such that substantially the same delay is generated for both the pulses P3 and P2 (where the delay amount is measured, for example, relative to the time t0). That is, it is desired to move from a pulse position W (e.g., which corresponds to the pulse P3) to a pulse position $W_{-1}$ (e.g., the previous pulse, which corresponds to the pulse P2). Let the delay amount corresponding to the pulse position W be F, and the delay amount corresponding to the pulse position $W_{-1}$ be F". As the pulse position currently used is W, the delay amount of F is known, and we want to predict the delay amount F″ corresponding to the new pulse position $W_{-1}$.

Given that the two pulses are to be generated with substantially similar delays relative to, for example, time t0, the following relationship holds:

$$W+F=W_{-1}+F''  \qquad \text{Equation 16}$$

Equation 16 is rearranged as follows:

$$F''=W-W_{-1}+F \qquad \text{Equation 17}$$

As illustrated in FIG. 4, the pulse P2 is half-clock period HP delayed with respect to the pulse P3. This, ($W-W_{-1}$) is half-clock period HP. Also, as seen from equation 3, the half-clock period HP is equal to (2*ID+2*q*d). Thus, equation 17 can be written as:

$$F''=(2*ID+2*q*d)+F. \qquad \text{Equation 18}$$

Let the delay value for delay select 390 for the pulse position W be f. That is, for the delay select 390 with the value of f, the delay amount is F. Similarly, let the delay value for delay select 390 for the pulse position $W_{-1}$ be f″. That is, for the delay select 390 with the value of f″, the delay amount is F″. Thus, F=(ID+f*d), and F″=(ID+r*d), as discussed with respect to FIG. 2. Thus, equation 18 can be rewritten as follows:

$$ID+f''*d=(2*ID+2*q*d)+(ID+f*d). \qquad \text{Equation 19}$$

Equation 19 can be written as:

$$f''*d=2*ID+2*q*d+f*d, \qquad \text{Equation 20}$$

As discussed with respect to equation 6, ID=(h−2q)*d. Replacing ID in equation 12 by the value of ID in equation 6, and dividing each side by d results in the following:

$$f''*d=2*h*d-4*q*d+2*q*d+f*d, \qquad \text{Equation 21}$$

which is rewritten as:

$$f''=2*h-2*q+f*d. \qquad \text{Equation 22}$$

Equation 22 is rewritten as:

$$f''=f+2(h-q). \qquad \text{Equation 23}$$

So, the new delay select f″ for the pulse position $W_{-1}$ can be determined from the old delay select f for the pulse position W, if the delay select values h and q are known. Also, the calibration circuit 304 of FIG. 7 outputs the delay select values h and q. Thus, the new delay select f″ for the pulse position $W_{-1}$ can be determined from equation 23.

Figure 8:
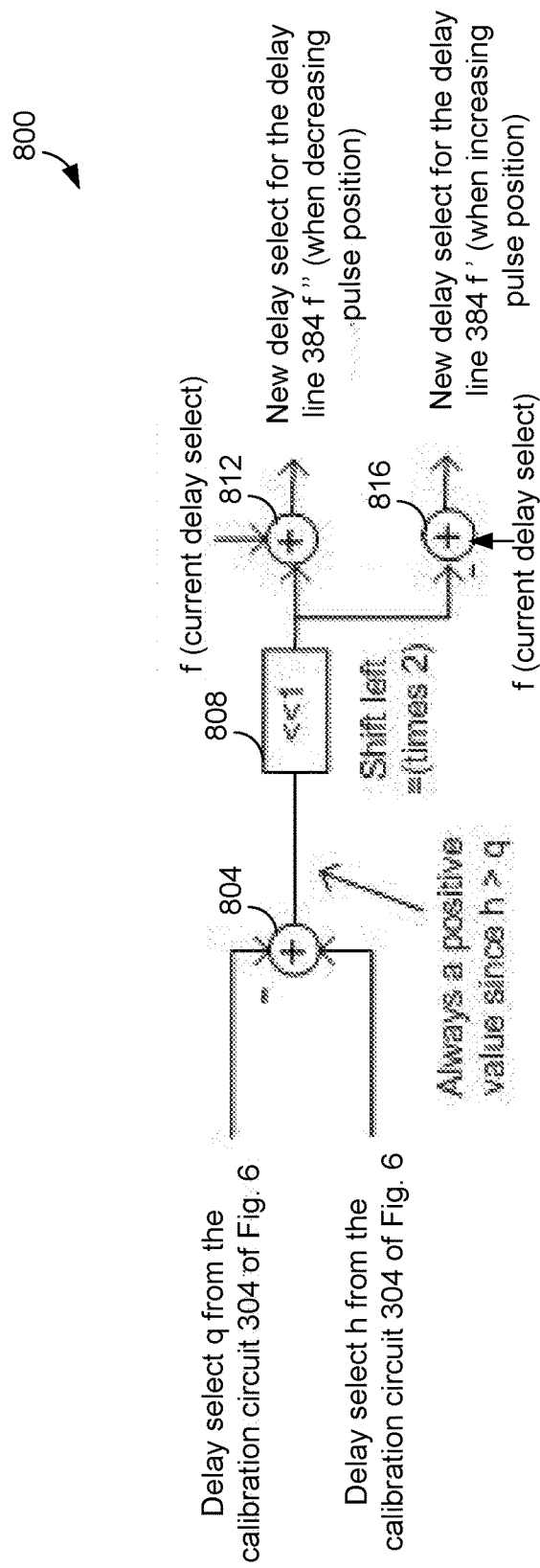
FIG. 8 illustrates a delay select update circuit configured to selectively update a delay select, in accordance with an embodiment.

FIG. 8 illustrates a delay select update circuit 800 (henceforth referred to as "circuit 800") configured to selectively update the delay select 390. In an embodiment, the circuit 800 is included in the control circuit 360. As discussed with respect to FIG. 3, the control circuit 360 receives the calibration parameters 356. In an embodiment, the calibration parameters 356 comprise delay selects q and h, as generated by the calibration circuit 304 of FIG. 6.

In an embodiment, the circuit 800 comprises a summation block 804, which receives the delay selects q and h from the calibration circuit 304 of FIG. 6. The summation block 804 outputs a difference between the delay selects h and q (e.g., outputs (h−q)). In an embodiment, a left shift block 808 shifts the output (h−q) twice, which is then received by two summation blocks 812 and 816.

The summation block 812 is relevant when a pulse position is decreased, e.g., from W to $W_{-1}$, as discussed with respect to equations 16-23. In an example, the summation block 812 implements equation 23. For example, the summation block 812 receives the delay select f and also receives (h−q), and outputs f″, which is equal to f+(h−q), as discussed with respect to equation 23.

The summation block 816 is relevant when a pulse position is increased, e.g., from W to $W_{+1}$, as discussed with respect to equations 7-15. In an example, the summation block 812 implements equation 15. For example, the summation block 812 receives the delay select f and also receives (h−q), and outputs f′, which is equal to f−(h−q), as discussed with respect to equation 15.

Thus, the circuit 800 outputs the updated delay selects f or f″, depending upon whether the pulse position is increased or decreased. In an embodiment, the updated delay select f or f″ can be used as the updated delay select 390 while controlling the delay line 384.

Figure 9:
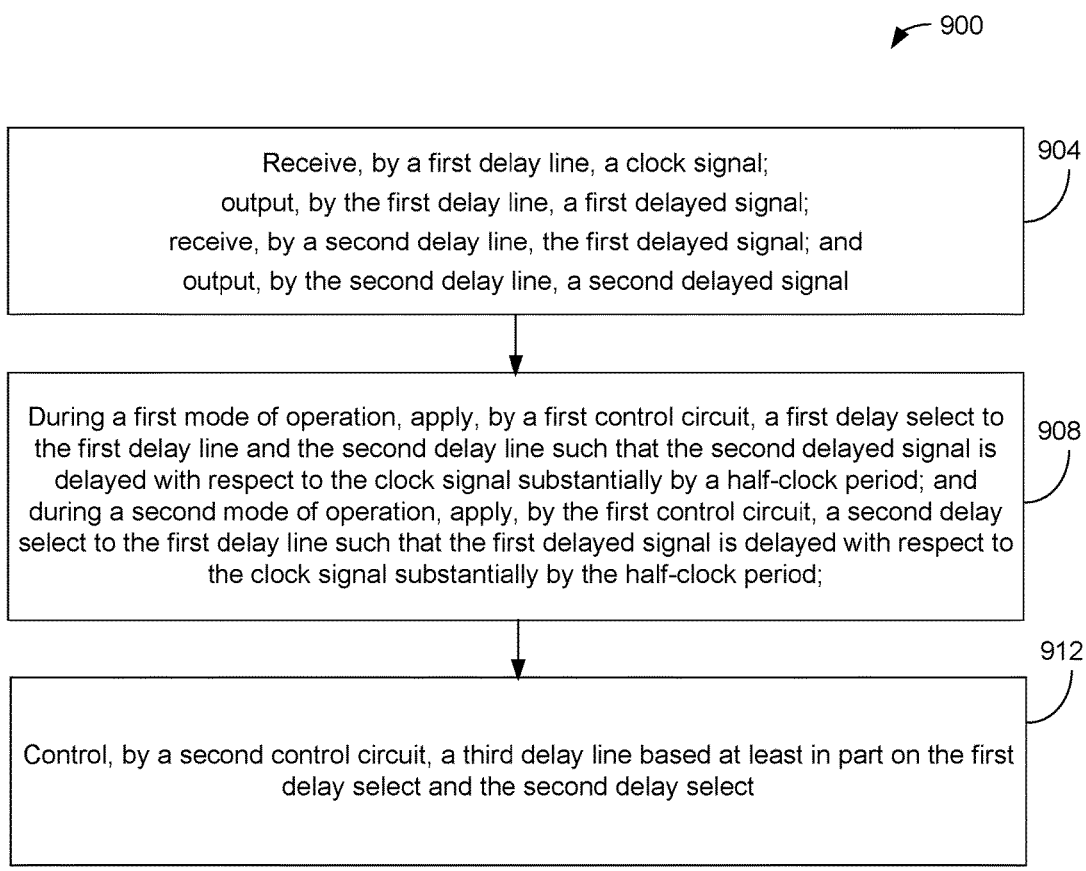
FIG. 9 illustrates a flow diagram of an example method for operating the circuit of FIG. 3, in accordance with an embodiment.

FIG. 9 illustrates a flow diagram of an example method 900 for operating a circuit (e.g., circuit 300) comprising a plurality of delay lines (e.g., delay lines 308, 312 and 384, as illustrated in FIG. 3). At 904, a first delay line (e.g., delay line 308) receives a clock signal (e.g., clock signal 392) and outputs a first delayed signal (e.g., signal C1). Also at 904, a second delay line (e.g., second delay line 312) receives the first delayed signal and outputs a second delayed signal (e.g., signal C2).

At 908, during a first mode of operation (e.g., while the QCL loop is enabled), a first control circuit (e.g., control circuit 316 illustrated in FIGS. 3 and 6) applies a first delay select (e.g., delay select q) to the first delay line and the second delay line such that the second delayed signal is delayed with respect to the clock signal substantially by a half-clock period. Also at 904, during a second mode of operation (e.g., while the HCD loop is enabled), the first control circuit applies a second delay select (e.g., delay select h) to the first delay line such that the first delayed signal is delayed with respect to the clock signal substantially by the half-clock period.

At 912, a second control circuit (e.g., the control circuit 360 of FIGS. 3 and 8) controls a third delay line (e.g., delay line 384) based at least in part on the first delay select and the second delay select, e.g., as discussed with respect to equations 15 and 23.

The description may use the phrases "in an embodiment," or "in embodiments," which may each refer to one or more of the same or different embodiments. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
  a calibration circuit comprising (i) a first delay line and (i) a second delay line, wherein the first delay line is configured to receive a clock signal and output a first delayed signal, and wherein the second delay line is configured to receive the first delayed signal and output a second delayed signal;
a first control circuit configured to,
during a first mode of operation, apply a first delay select to the first delay line and the second delay line such that the second delayed signal is delayed with respect to the clock signal substantially by a half-clock period, and
during a second mode of operation, apply a second delay select to the first delay line such that the first delayed signal is delayed with respect to the clock signal substantially by the half-clock period;
an application circuit comprising a third delay line; and
a second control circuit configured to (i) receive the first delay select and the second delay select, and (ii) control the third delay line based at least in part on the first delay select and the second delay select.

2. The apparatus of claim 1, wherein the first control circuit comprises:
a first phase detect comparator;
a first counter, wherein the first delay line, the second delay line, the first phase detect comparator and the first counter are arranged in a first delay locked loop;
a second phase detect comparator; and
a second counter, wherein the first delay line, the second phase detect comparator and the second counter are arranged in a second delay locked loop.

3. The apparatus of claim 2, wherein the first control circuit further comprises:
a multiplexer configured to
receive (i) an output of the first counter and (ii) an output of the second counter, and
selectively transmit the output of the first counter or the output of the second counter to each of the first delay line and the second delay line.

4. The apparatus of claim 3, wherein the multiplexer is further configured to:
during the first mode of operation, transmit the output of the first counter to each of the first delay line and the second delay line; and
during the second mode of operation, transmit the output of the second counter to each of the first delay line and the second delay line.

5. The apparatus of claim 2, wherein the first phase detect comparator is configured to:
receive (i) the second delayed signal from the second delay line and (ii) the clock signal;
output a first value, in response to the second delayed signal being delayed with respect to the clock signal by an amount that is less than the half-clock period; and
output a second value, in response to the second delayed signal being delayed with respect to the clock signal by an amount that is more than the half-clock period.

6. The apparatus of claim 5, wherein the first counter is configured to:
in response to receiving the first value from the first phase detect comparator, increment an output of the first counter; and
in response to receiving the second value from the first phase detect comparator, decrement the output of the first counter.

7. The apparatus of claim 2, wherein:
the second phase detect comparator is configured to receive (i) the first delayed signal from the first delay line and (ii) the clock signal,
output a first value, in response to the first delayed signal being delayed with respect to the clock signal by an amount that is less than the half-clock period, and
output a second value, in response to the first delayed signal being delayed with respect to the clock signal by an amount that is more than the half-clock period; and
the second counter is configured to (i) in response to receiving the first value from the second phase detect comparator, increment an output of the second counter, and (ii) in response to receiving the second value from the second phase detect comparator, decrement the output of the second counter.

8. The apparatus of claim 1, wherein the half-clock period is a time period of a half clock cycle of the clock signal.

9. The apparatus of claim 1, wherein:
the application circuit comprises a pulse generator configured to generate a stream of pulses;
while the third delay line receives a first pulse of the stream of pulses, the third delay line operates in accordance with a current delay select such that the first pulse is delayed with respect to a raising edge of a first clock cycle by a first delay amount;
while the third delay line receives a second pulse of the stream of pulses, the third delay line operates in accordance with a updated delay select such that the second pulse is delayed with respect to a raising edge of the first clock cycle substantially by the first delay amount; and
the second control circuit is further configured to estimate the updated delay select, based at least in part on (i) the current delay select, (ii) the first delay select, and (iii) the second delay select.

10. The apparatus of claim 9, wherein:
a first factor is equal to twice the difference between the first delay select and the second the delay select; and
the second control circuit is further configured to estimate the updated delay select such that the updated delay select is based on either (i) a difference between the current delay select and the first factor, or (ii) a sum of the current delay select and the first factor.

11. A method comprising:
receiving, by a first delay line, a clock signal;
outputting, by the first delay line, a first delayed signal;
receiving, by a second delay line, the first delayed signal;
outputting, by the second delay line, a second delayed signal;
during a first mode of operation, applying, by a first control circuit, a first delay select to the first delay line and the second delay line such that the second delayed signal is delayed with respect to the clock signal substantially by a half-clock period;
during a second mode of operation, applying, by the first control circuit, a second delay select to the first delay line such that the first delayed signal is delayed with respect to the clock signal substantially by the half-clock period; and
controlling, by a second control circuit, a third delay line based at least in part on the first delay select and the second delay select.

12. The method of claim 11, further comprising:
arranging the first delay line, the second delay line, a first phase detect comparator and a first counter in a first delay locked loop; and arranging the first delay line, a second phase detect comparator and a second counter in a second delay locked loop.

13. The method of claim 12, further comprising:
receiving, by a multiplexer, (i) an output of the first counter and (ii) an output of the second counter; and
selectively transmitting, by the multiplexer, the output of the first counter or the output of the second counter to the first delay line and the second delay line.

14. The method of claim 13, wherein selectively transmitting the output of the first counter or the output of the second counter to each of the first delay line and the second delay line comprises:
during the first mode of operation, transmitting the output of the first counter to each of the first delay line and the second delay line; and
during the second mode of operation, transmitting the output of the second counter to the first delay line.

15. The method of claim 12, further comprising:
receiving, by the first phase detect comparator, (i) the second delayed signal from the second delay line and (ii) the clock signal;
outputting, by the first phase detect comparator, a first value, in response to the second delayed signal being delayed with respect to the clock signal by an amount that is less than the half-clock period; and
outputting, by the first phase detect comparator, a second value, in response to the second delayed signal being delayed with respect to the clock signal by an amount that is more than the half-clock period.

16. The method of claim 15, further comprising:
in response to receiving the first value from the first phase detect comparator, incrementing, by the first counter, an output of the first counter; and
in response to receiving the second value from the first phase detect comparator, decrementing, by the first counter, the output of the first counter.

17. The method of claim 12, further comprising:
receiving, by the second phase detect comparator, (i) the first delayed signal from the first delay line and (ii) the clock signal;
outputting, by the second phase detect comparator, a first value, in response to the first delayed signal being delayed with respect to the clock signal by an amount that is less than the half-clock period;
outputting, by the second phase detect comparator, a second value, in response to the first delayed signal being delayed with respect to the clock signal by an amount that is more than the half-clock period;
in response to receiving the first value from the second phase detect comparator, incrementing, by the second counter, an output of the second counter; and
in response to receiving the second value from the second phase detect comparator, decrementing, by the second counter, the output of the second counter.

18. The method of claim 11, wherein the half-clock period is a time period of a half clock cycle of the clock signal.

19. The method of claim 11, further comprising:
generating, by a pulse generator, a stream of pulses;
while the third delay line receives a first pulse of the stream of pulses, operating, by the third delay line, in accordance with a current delay select such that the first pulse is delayed with respect to a raising edge of a first clock cycle by a first delay amount;
while the third delay line receives a second pulse of the stream of pulses, operating, by the third delay line, in accordance with an updated delay select such that the second pulse is delayed with respect to a raising edge of the first clock cycle substantially by the first delay amount; and
estimating, by the second control circuit, the updated delay select, based at least in part on (i) the current delay select, (ii) the first delay select, and (iii) the second delay select.

20. The method of claim 19, wherein a first factor is equal to twice the difference between the first delay select and the second the delay select, and wherein estimating the updated delay select comprises:
estimating the updated delay select such that the updated delay select is based on either (i) a difference between the current delay select and the first factor, or (ii) a sum of the current delay select and the first factor.

* * * * *